United States Patent [19]

Porterfield et al.

[11] Patent Number: 5,051,555
[45] Date of Patent: Sep. 24, 1991

[54] HOT-BAR SUSPENSION SYSTEM

[75] Inventors: Richard F. Porterfield, Binghamton, N.Y.; Thomas M. Alunni, Jessup, Pa.; Frank Ksionzyk, Port Crane; Michael D. Snyder, Binghamton, both of N.Y.

[73] Assignee: Universal Instruments Corporation, Binghamton, N.Y.

[21] Appl. No.: 484,571

[22] Filed: Feb. 26, 1990

[51] Int. Cl.$^5$ ................................................ B23K 3/04
[52] U.S. Cl. .............................. 219/85.16; 219/85.18
[58] Field of Search ...................... 219/85.6, 229, 230; 228/5.5, 44.7, 106; 248/913

[56] References Cited

U.S. PATENT DOCUMENTS

| | | | |
|---|---|---|---|
| 3,790,738 | 2/1974 | Laub et al. | 219/85.14 |
| 4,768,702 | 9/1988 | Takahashi et al. | 228/5.5 |
| 4,851,648 | 7/1989 | Jacobs et al. | 228/44.7 |
| 4,875,614 | 10/1989 | Cipolla et al. | 228/5.5 |

Primary Examiner—Geoffrey S. Evans
Attorney, Agent, or Firm—Fidelman & Wolffe

[57] ABSTRACT

Compensation is made for inherent lateral shifting of portions of a pivoted working surface along a work surface, when the pivot point of the working surface is maintained on a line of feed into contact with said work surface, during relative pivoting of said working surface into conformity with said work surface. The working surface is supported by a quadrilateral linkage system having a remote instantaneous center point which, during pivoting of the working surface, is maintained substantially on a quiescent centerline of the linkage system. By spacing the pivot point of the working surface from this center point along the centerline, the pivot point is caused to move laterally of the centerline during exercising of the linkage system. The distance and direction of spacing the pivot point from the center point is selectable so as to cancel the inherent lateral shifting referred above. A preferred embodiment of the invention maintains the working surface in the tilted position of conformity with the work surface during subsequent withdrawal of the working surface therefrom.

8 Claims, 4 Drawing Sheets

HOT-BAR SUSPENSION SYSTEM

PRIOR ART CROSS REFERENCE

U.S. Pat. No. 3,790,738—PULSED HEAT EUTECTIC BONDER—Laub et al, issued Feb. 5, 1974.

U.S. Pat. No. 4,768,702—DIE BONDING APPARATUS—Takahashi, et al, issued Sept. 6, 1988.

U.S. patent application Ser. No. 463,456—HIGH FREQUENCY THERMODE DRIVEN DEVICE EMPLOYING ONE-TURN-SECONDARY TRANSFORMERS—Paufve, et al, filed Jan. 11, 1990.

Advertising brochure by Siemens A. G.—THE BS-15 HOT-BAR SOLDERING SYSTEM—undated.

BACKGROUND OF THE INVENTION

The invention is in the field of hot bar soldering of the leads of surface mountable components (so-called SMC's) to conductive tracks on the surface of circuit boards or the like and, more particularly, is directed to a floating suspension of the hot bars or thermodes.

Each site on a circuit board at which an SMC is to be mounted has conductive solder pads arranged thereon in a pattern which is identical to a pattern defined by the tips of the leads of the component.

The above-referenced U.S. patent application Ser. No. 463,456 is illustrative of a device for attaching the leads to the solder pads by applying heat and pressure. Each component is held by vacuum to the tip of a hollow spindle so that it may be transported and placed on the circuit board by the spindle, with each component lead resting on a corresponding solder pad. Then, a coaxially supported arrangement of heating bars is telescoped down into engagement with the leads, such that each bar contacts all of the leads which are situated along a corresponding edge of the component. Typically, the bars are applied to the leads with heat enough to melt the solder and with pressure sufficient to push the leads through the melted solder and into contact with conductive tracks of the circuit board, after which the heating is halted sufficiently for the solder to resolidify.

A typical problem with hot-bar soldering has been maintaining contact between the thermodes and the component leads during the soldering cycle. If the plane formed by the working surface of the thermodes is not parallel to the plane defined by the traces of the substrate, uneven heating of the solder will occur.

The above-referenced U.S. Pat. No. 4,768,702 provides for "floating" of the thermodes of a hot-bar soldering device, wherein the thermode assembly is suspended by means of a pair of quadrilateral linkage mechanisms situated at right angles to each other. Thus, a thermode working surface is tiltable to conform to a work surface inclination during advancement of the thermode into engagement with the work.

It is an object of the invention to utilize a quadrilateral linkage floating support for a thermode in such a way as to overcome problems that would be encountered by the device of U.S. Pat. No. 4,768,702 in attempting to hot-bar solder the leads of components on the order of size of so-called "square packs" which are about 1-2 inches on a side.

It is also an object of the invention to overcome problems encountered when hot-bar soldering such components with thermodes which are tiltable by means other than a quadrilateral linkage arrangement.

More specifically, it is an object of the invention to prevent shifting of the work along the substrate by the thermode working surface which is at an angle to the work surface plane during initial contact and prior to achieving a smooth interface therebetween.

Further, it is an object of the invention to improve the solder bonds resulting from hot-bar soldering while also minimizing subsequent bonding failures which can occur when a lead deviates from a nominal work surface plane prior to being contacted by the thermode.

These and other objects of the invention will become more apparent from the following disclosure.

SUMMARY OF THE INVENTION

Compensation is made for inherent lateral shifting of portions of a pivoted working surface along a work surface, when the pivot point of the working surface is maintained on a line of feed into contact with said work surface, during relative pivoting of said working surface into conformity with said work surface. The working surface is supported by a quadrilateral linkage system having a remote instantaneous center point which, during pivoting of the working surface, is maintained substantially on a quiescent centerline of the linkage system. By spacing the pivot point of the working surface from this center point along the centerline, the pivot point is caused to move laterally of the centerline during exercising of the linkage system. The distance and direction of spacing the pivot point from the center point is selectable so as to cancel the inherent lateral shifting referred above. A preferred embodiment of the invention maintains the working surface in the tilted position of conformity with the work surface during subsequent withdrawal of the working surface therefrom.

DETAILED DESCRIPTION OF THE INVENTION

Like numbers have been used for like members throughout the drawings, where applicable.

Figure 1:
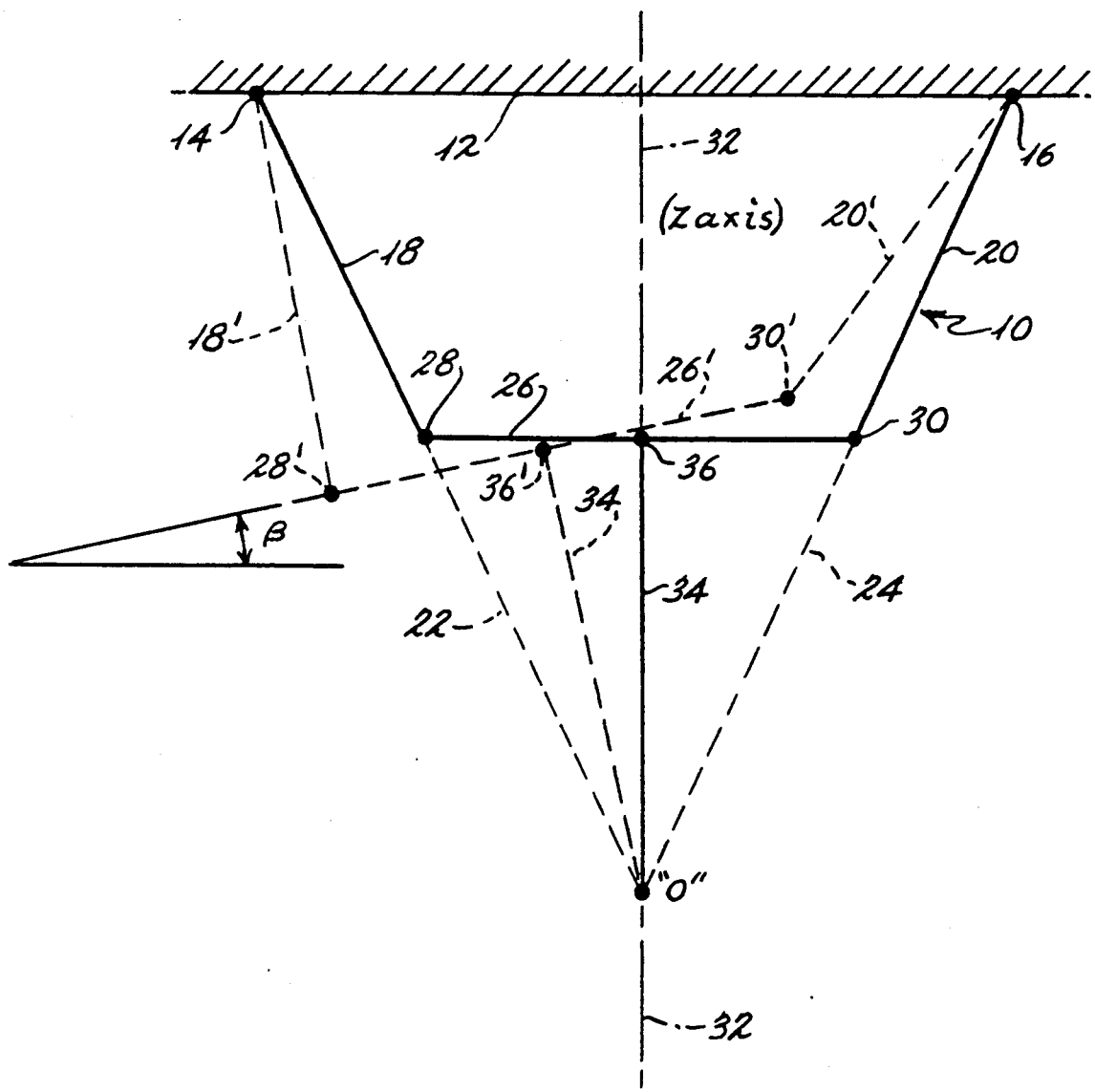
FIG. 1 is a schematic illustrating a quadrilateral linkage system used in the invention.

FIG. 1 is an illustration of only one of the several similar quadrilateral linkage systems 10 utilized in the invention. A mounting surface 12 acts as a top link of the system, and two converging links 18 and 20 are pivotally suspended therefrom respectively at points 14 and 16. A bottom link 26 is suspended from links 18 and 20, respectively, at points 28 and 30. The convergent links 18 and 20 focus on a remote instantaneous centerpoint 0, at the intersection of virtual lines of extension 22,24 of links 18 and 20, in the quiescent or unexercised condition of the linkage.

Thus, as may be seen from FIG. 1, a rigid member 34 may be rigidly attached at point 36 to bottom link 26 so as to extend down to the instantaneous remote centerpoint 0 when the linkage for the system is relaxed. Further, it may be seen in FIG. 1 that, by exercising the linkage so as to tilt link 26 through an angle $\beta$, that the instantaneous center-point 0 when link 26 is at rest (horizontal) is the same as when link 26 is tilted at a selected angle $\beta$ relative to the horizontal.

Figure 2:
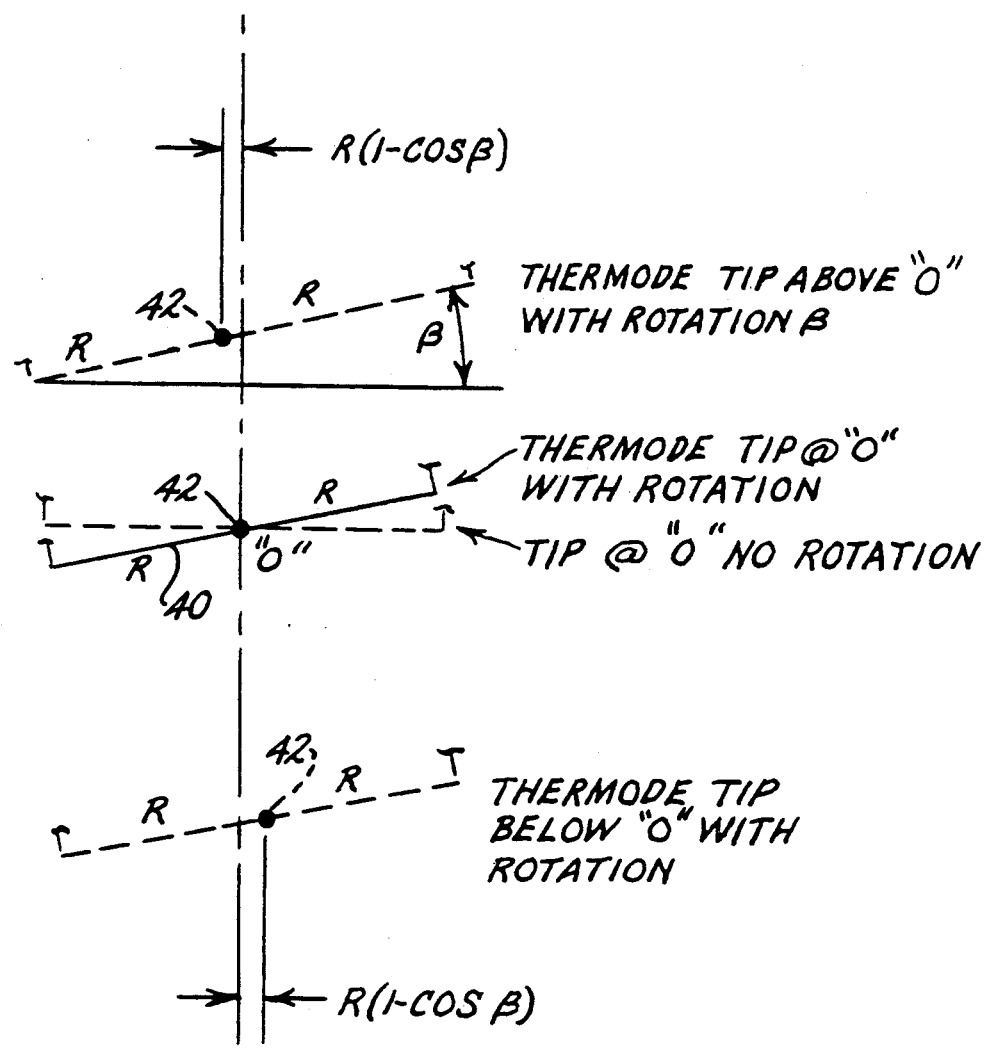
FIG. 2 is a schematic illustrating the novel method of compensating for inherent lateral shifting of a pivotal working surface relative to a work surface during conformance of the two surfaces.

Referring to FIG. 2, the working surface 40 of a thermode or the like may have a mid-point 42 thereof at which the thermode is attached to the end of member 34 so as to be parallel to link 26 at all times. Thus, the working surface of the thermode at 0° and $\beta$° will have mid-point 42 coinciding with the instantaneous remote center 0.

If, however, member 34 is shortened such that the working surface 40 of the thermode is positioned above the instantaneous remote center 0, then the mid-point 42 of the thermode working surface will be displaced to the left of the center line as the working surface is rotated through the angle $\beta$ as shown, with this displacement being equal to $R(1-\cos\beta)$.

Conversely, if the thermode working surface 40 is positioned below the remote instantaneous center-point 0, then the mid-point 42 of the working surface will be displaced to the right of the center line upon rotation of the working surface 40 through the angle $\beta$, with the displacement again equalling $R(1-\cos\beta)$. Thus, for a given angle $\beta$ it may be seen that the amount of lateral displacement of the mid-point of the thermode from the quiescent center line of the linkage assembly may be selected according to the spacing of the working surface 40 of the relaxed thermode along the center line from the instantaneous center-point 0. The direction of displacing depends upon situation of the surface 40 above or below the instantaneous center-point 0.

Figure 3:
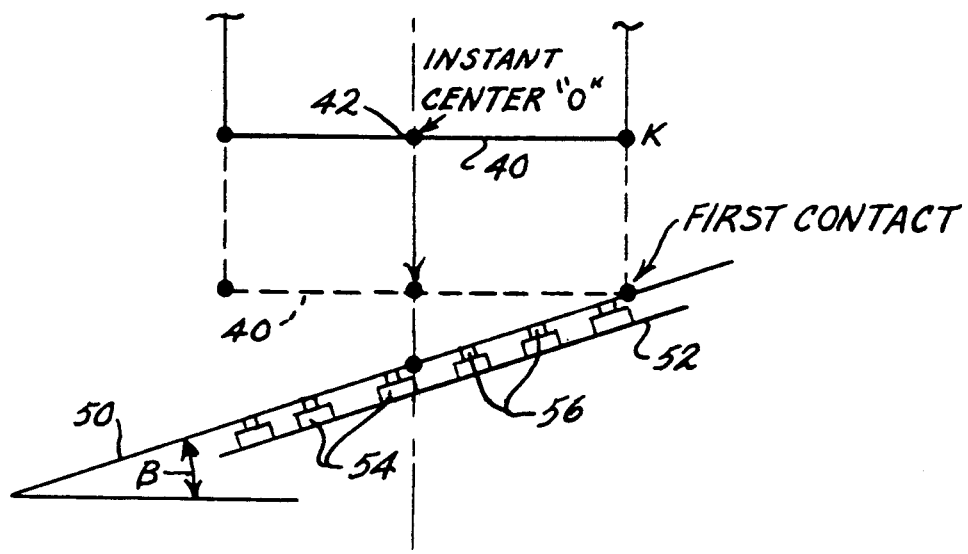
FIGS. 3 and 4 are schematics illustrating inherent lateral shifting of a pivotal working surface relative to a work surface during conformance of the two surfaces.
Figure 4:
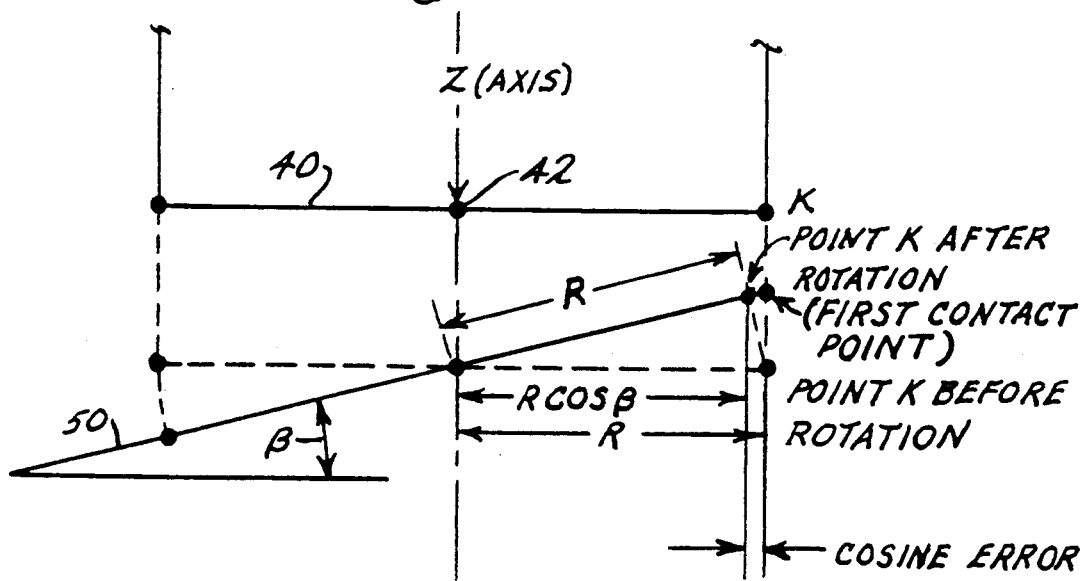

Turning to FIGS. 3 and 4, a portion of a printed circuit board 52 may be tilted, at a component placement site, due to board warpage or the like. Typically, a center of the placement pad arrangement is optically located and the center or Z-axis of the vacuum spindle (not shown) holding a component is aligned with the center point of the placement site whereupon a component supported by the vacuum spindle is placed such that the leads 56 of the component are positioned on top of the solder pads 54 of the placement site, with the tip of the vacuum spindle being sufficiently compliant to maintain control of the component while allowing the component to conform to the angle of the board at the placement site.

Thereafter, if the thermode working surface 40 is advanced while maintaining the mid-point 42 on a feed line parallel to the Z-axis, then a point K at the right hand end of the thermode assembly will make first contact with the far right hand lead 56 of the component. Since the mid-point 42 of the thermode is maintained on the center line and the thermode is pivoted about mid-point 42 to conform with angle $\beta$, point K (as seen in FIG. 4) will move laterally toward the center line during rotation of the thermode 40 and tend to push the lead which it is engaging toward the center line by an amount $R(1-\cos\beta)$ until thermode surface 40 is angled to conform to the top surfaces of the leads 56 along an interface plane 50.

In other words, since that first contact point K is the only part of the thermode in contact with the component leads on the board, the component lead(s) touching point K will be the only one(s) feeling any forces from the thermode. The thermode will not touch all of the remainder of the leads 56 until rotation is complete through angle $\beta$. Thus, the relative motion of point K along the board during rotation will try to drag or push the leads in toward the center of rotation.

What it is desirous to achieve is that no side forces or net motion of point K relative to the board be generated as rotation through angle $\beta$ is achieved. Elimination of such relative side dragging of point K could be achieved if we locate the working surface 40 of the thermode below the remote instantaneous center of the quadrilateral linkage assembly, as illustrated in FIG. 2, so that rotation of the thermode working surface 40 through the angle $\beta$ will cause the center 42 of the thermode surface to move to the right by an amount equal to $R(1-\cos\beta)$. This would have the effect of creating only downward forces on the component lead at point K and no net side forces trying to skid the component leads 56 off of the solder pads 54.

Figure 5:
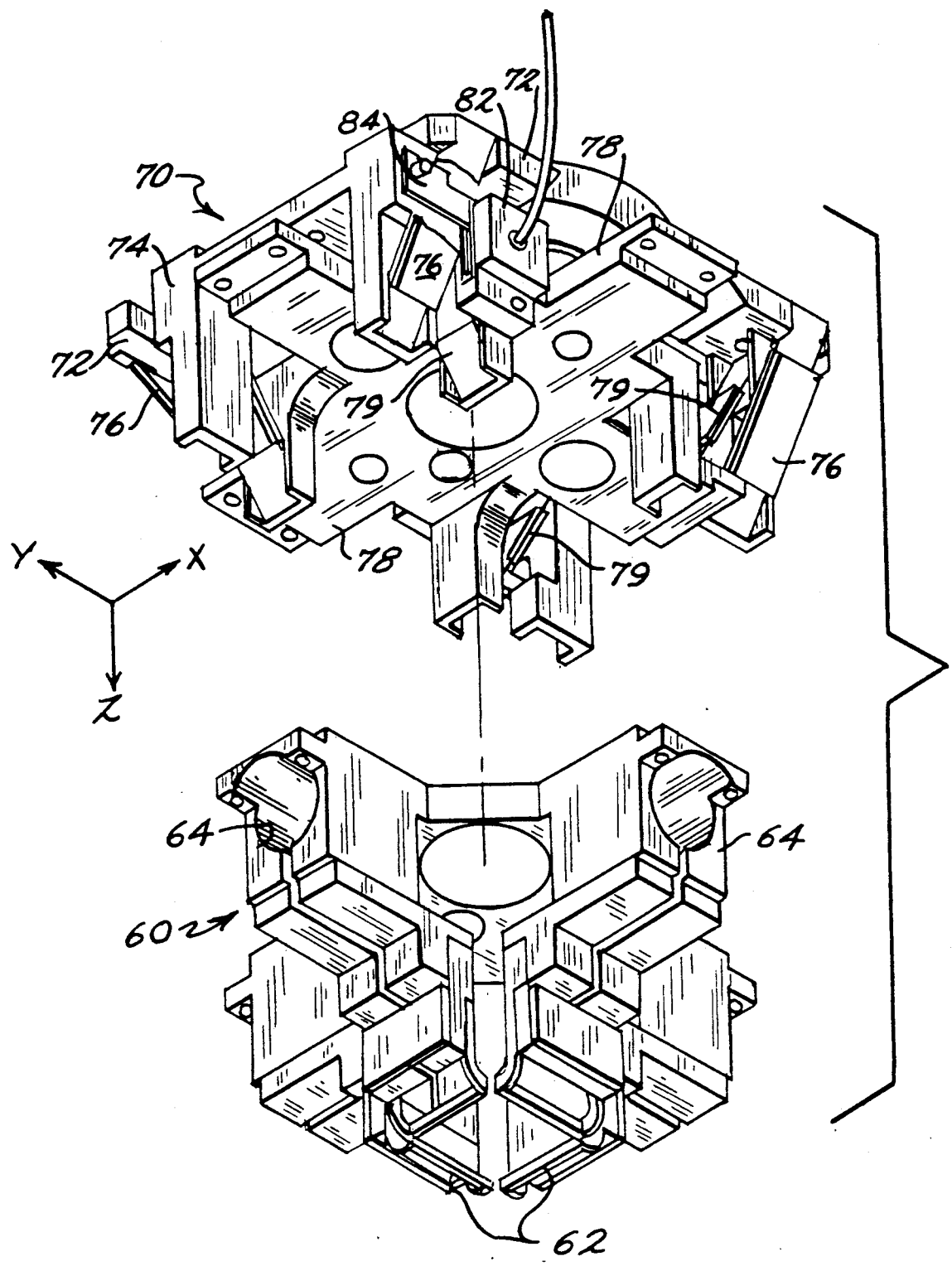
FIG. 5 is an isometric view of an apparatus utilizing a preferred embodiment of the invention.

A preferred structural implementation of the invention is illustrated in FIG. 5, in which a thermode assembly 60 having thermodes 62 and transformers 64 may be attached to and supported by a floating support 70 in a manner which is apparent from the Figure. Floating support 70 comprises a mounting plate 72 which is attachable to an overhead support such as a robot arm or the like and a frame 74 is suspended from mounting plate 72 by means of four leaf springs 76 which correspond to a pair of parallel quadrilateral linkage assemblies wherein converging leaf springs 76 relate to links 18 and 20 of FIG. 1 and allow displacement of frame 74 relative to mounting plate 72 in the X-direction. In turn, frame 74 supports frame 78 by means of leaf springs 79 which relate to the converging legs of a pair of quadrilateral linkages arranged at right angles to the linkages of springs 76, so as to allow movement of frame 78 in the Y-direction upon exercising of the linkage. The thermode assembly 60 is attached to frame 78, so as to displaceable in X and Y while being tiltable in a manner similar to that illustrated in FIG. 1.

Thus, the apparatus uses a nested pair of four bar linkages with pivots simulated by flexures in the form of leaf springs 76 and 79. Although these flexures have a small spring centering force, they provide a virtually friction-free pivot that is immune to contamination by the soldering fluxes used in this process.

Another problem associated with this process, is that individual component leads that exhibit deviations from coplanarity (i.e., an individual lead may be bent so as to protrude on the order of 0.004 inches above the nominal plane of the leads of a component) are forced into a common plane 50 with the remaining leads 56 during conformity of the thermode to the slope of the circuit board surface, whereupon the leads 56 are soldered. Thus, those leads that deviated from coplanarity prior to being engaged by the thermode are soldered in a strained or stressed state, such that the resulting stresses can cause the affected solder joint to fail over time.

In order to solve this problem, a blade 84 is fixed to frame 74 and a bellows clamp 82 is fixed to frame 78 so as to form a locking mechanism in which springs 79 may be retained in an exercised or flexed position. A corresponding braking or locking mechanism is provided between mounting plate 72 and frame 74 (but cannot be seen in the drawing) in order to lock or maintain springs 76 in a flexed position. Thus, a brake or locking mechanism is provided in each of the two axes of compliance of the floating support.

The brake mechanism is provided to solve the problem of soldering prebent leads in a strained state. By locking the thermode in an orientation of compliance with the substrate plane at the soldering cite, the thermode may be withdrawn while in that locked orientation so that there is an equal distance between the thermode and the board over the length of the thermode prior to the solder reaching the solidus point, thus allowing the component leads to relax to a predetermined height of withdrawal of the thermode from the board prior to solder solidification.

The particular height of withdrawal of the thermode from the board prior to solder solidification can be prearranged such that the thermode is raised out of engagement with the majority of the leads (i.e., those leads which are not prebent) so that solder is allowed to get between the working surface of the thermodes and the tops of the leads and/or between the circuit board and the leads, resulting in a much better solder joint.

The above apparatus was designed for a $\beta$ tilt in excess of 2° before a hard stop, with an optimum tilt angle of 1°. A mean thermode length was 1 inch and mean tilt angle was 1°. The spindle force applied was typically 1 pound, while that of the thermode was 10 pounds.

The components to be soldered were generally 1-2 inches on a side, with lead heights of 3-4 mils, so that for solder pad heights of 4-6 mils, the top of a lead was generally 7-10 mils above the surface of the printed circuit board after attachment. It is considered to be well within the concept of the invention that other than square-top components may be operated on. For instance, for rectangular-top components, aspect ratios of the quadrilateral linkages corresponding to each side may be appropriately proportioned.

The following claims are intended to cover all of the generic and specific features of the invention herein described and all statements of the scope of the invention which, as a matter of language, might be said to fall therebetween.

Now that the invention has been described, We claim:

1. In a method of aligning a working surface and a work surface by pivoting one of said surfaces through an angle of inclination therebetween and into surface contact with the other of said surfaces during relative advancing of said pivoting surface along a line of feed which intersects said other surface at an angle which is complimentary to said angle of inclination and wherein said pivoting surface is supported by a quadrilateral linkage assembly which, when at rest, is trapezoid shaped and defines a remote center-point at the intersection of virtual lines of extension of converging links of the trapezoid with said center-point falling on a centerline coaxial with said line of feed, the improvement comprising the steps of:

positioning a pivot point of said pivoting surface on and spaced along said centerline from said remote center-point in order to cause displacing of said pivot point laterally of said line of feed by an amount commensurate with said positioning and in response to said pivoting of said one surface into surface contact with said other surface; and utilizing said displacing to prevent a relative sliding motion between said surfaces which can occur if said pivot point is maintained on said centerline during said pivoting of said surfaces.

2. In an apparatus for aligning a working surface and a work surface by pivoting one of said surfaces through an angle of inclination therebetween and into surface contact with the other of said surfaces during relative advancing of said pivoting surface along a line of feed which intersects said other surface at an angle which is complimentary to said angle of inclination and wherein said pivoting surface is supported by a quadrilateral linkage assembly which, when at rest, is trapezoid shaped and defines a remote center-point at the intersection of virtual lines of extension of converging links of the trapezoid with said center-point falling on a centerline coaxial with said line of feed, the improvement comprising:

a pivot point of said pivoting surface being positioned on and spaced along said centerline from said remote center-point such that said pivot point is displaceable laterally of said line of feed by an amount commensurate with said positioning and in response to said pivoting of said one surface into surface contact with said other surface; and whereby said displacing prevents a relative sliding motion between said surfaces which occurs during said pivoting of said surfaces if said pivot point is maintained on said centerline during said pivoting of said surfaces.

3. A floating support for a soldering device, said device having at least two heating bars situated on opposite sides of a Z-axis with working surfaces of said bars defining a working plane, said floating support providing for tilting of said working plane into conformity with a work plane, said support comprising:

a mounting plate;

a first frame attached to said mounting plate and spaced therefrom along said Z-axis via a first pair of quadrilateral linkage systems, said first pair being spaced apart in a Y-axis direction, with linkage of each system defining and being pivotal in a corresponding X-Z plane;

a second frame attached to said first frame and spaced therefrom via a second pair of quadrilateral linkage systems, said second pair being spaced apart in an X-axis direction, with linkage of each said second linkage system defining and being pivotal in a corresponding Y-Z plane; and brake means for selectively retaining at least one of said frames and pair of linkage systems corresponding thereto in a position at which said working plane is in conformity with said work plane.

4. A floating support as in claim 3, wherein:

said quadrilateral linkage systems each comprise a pair of leaf springs converging on a focus point for each working surface and through a centerline of said linkage system when said linkage is at rest; and each said working surface being situated a selected distance below said focus point corresponding thereto, so as to displace a mid-point of said working surface laterally of said centerline by an amount according to said selected distance upon exercising of said linkage system.

5. A soldering device and floating support therefor, said device having at least two heating bars situated on opposite sides of a Z-axis with working surfaces of said bars defining a working plane, said floating support providing for tilting of said working plane into conformity with a work plane, and comprising:

a mounting plate;

a first frame attached to said mounting plate and spaced therefrom along said Z-axis via a first pair of quadrilateral linkage systems, said first pair being spaced apart in a Y-axis direction, with linkage of each system defining and being pivotal in a corresponding X-Z plane;

a second frame attached to said first frame and spaced therefrom via a second pair of quadrilateral linkage systems, said second pair being spaced apart in an X-axis direction, with linkage of each said second linkage system defining and being pivotal in a corresponding Y-Z plane; and said quadrilateral linkage systems overlapping said soldering device in a Z-axis direction such that an overall Z-axis dimension of said soldering device and floating support is minimized.

6. A floating support as in claim 5, wherein:

said quadrilateral linkage systems each comprise a pair of leaf springs converging on a focus point for each working surface and through a centerline of said linkage system when said linkage is at rest; and each said working surface being situated a selected distance below said focus point corresponding thereto, so as to displace a mid-point of said working surface laterally of said centerline by an amount according to said selected distance upon exercising of said linkage system.

7. A floating support as in claim 5, and further comprising:

brake means for selectively retaining at least one of said frames and pair of linkage systems corresponding thereto in a position at which said working plane is in conformity with said work plane.

8. A floating support for a soldering device, said device having at least two heating bars situated on opposite sides of a Z-axis with working surfaces of said bars defining a working plane, said floating support providing for tilting of said working plane into conformity with a work plane, said support comprising:

a mounting plate;

a first frame attached to said mounting plate and spaced therefrom along said Z-axis via a first pair of quadrilateral linkage systems, said first pair being spaced apart in a Y-axis direction, with linkage of each system defining and being pivotal in a corresponding X-Z plane;

a second frame attached to said first frame and spaced therefrom via a second pair of quadrilateral linkage systems, said second pair being spaced apart in an X-axis direction, with linkage of each said second linkage system defining and being pivotal in a corresponding Y-Z plane;

said quadrilateral linkage systems each comprising a pair of leaf springs converging on a focus point for each working surface and through a centerline of said linkage system when said linkage is at rest; and each said working surface being situated a selected distance below said focus point corresponding thereto, so as to displace a mid-point of said working surface laterally of said centerline by an amount according to said selected distance upon exercising of said linkage system.

* * * * *